United States Patent
Rus et al.

(10) Patent No.: US 9,286,312 B2
(45) Date of Patent: Mar. 15, 2016

(54) DATA CORESET COMPRESSION

(71) Applicants: Daniela Rus, Weston, MA (US); Dan Feldman, Cambridge, MA (US)

(72) Inventors: Daniela Rus, Weston, MA (US); Dan Feldman, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 260 days.

(21) Appl. No.: 13/861,697

(22) Filed: Apr. 12, 2013

(65) Prior Publication Data

US 2013/0275400 A1    Oct. 17, 2013

Related U.S. Application Data

(60) Provisional application No. 61/623,842, filed on Apr. 13, 2012.

(51) Int. Cl.
G06F 7/00    (2006.01)
G06F 17/30    (2006.01)
H03M 7/30    (2006.01)

(52) U.S. Cl.
CPC ....... *G06F 17/30153* (2013.01); *H03M 7/3064* (2013.01)

(58) Field of Classification Search
None
See application file for complete search history.

(56) References Cited

U.S. PATENT DOCUMENTS

2011/0298610 A1* 12/2011 Etkin et al. ................. 340/539.3

OTHER PUBLICATIONS

Abam et al., "Streaming Algorithms for Line Simplification," Discrete Comput Geom (2010) 43: 497-515.
Cudre-Mauroux et al., "TrajStore: An Adaptive Storage System for Very Large Trajectory Data Sets," Data Engineering (ICDE), 2010 IEEE 26th International Converence, 2010, pp. 109-120.
Feldman et al., "Coresets for Weighted Facilities and Their Applications," Proceedings of the 47th Annual IEEE Symposium on Foundations of Computer Science, Oct. 1, 2006, pp. 1-10.
Feldman et al., "A Unified Framework for Approximating and Clustering Data," STOC'11, Jun. 6-8, 2011, pp. 1-10.
Feldman et al., "An Effective Coreset Compression Algorithm for Large Scale Sensor Networks," Proceedings of the 11th International Conference on Information Processing in Sensor Networks) (IPSN '12) 2012, pp. 1-12.
Feldman et al., "The Single Pixel GPS: Learning Big Data Signals from Tiny Coresets," ACM SIGSPATIAL GIS' 12, Nov. 6-12, 2012, pp. 1-10.
Gandhi et al., "Catching Elephants with Mice: Sparse Sampling for Monitoring Sensor Networks," SenSys '07, Nov. 6-9, 2007, pp. 1-14.

* cited by examiner

*Primary Examiner* — Hosain Alam
*Assistant Examiner* — Thu Nga Nguyen
(74) *Attorney, Agent, or Firm* — Occhiuti & Rohlicek LLP

(57) ABSTRACT

An approach to compression of a large (n point or samples) data set has a combination of one or more desirable technical properties: for a desired level of accuracy ($\epsilon$), the number of compressed points (a "coreset") representing the original data is O(log n); the level of accuracy comprises a guaranteed bound expressed as multiple of error of an associated line simplification of the data set; for a desired level of accuracy and a complexity (e.g., number k of optimal line segments) of the associated line simplification, the computation time is O(n); and for a desired level of accuracy (c) and a complexity of the associated line simplification, the storage required for the computation is O(log n).

21 Claims, 2 Drawing Sheets

DATA CORESET COMPRESSION

CROSS-REFERENCE TO RELATED APPLICATIONS

This application claims the benefit of U.S. Provisional Application No. 61/623,842, titled "An Effective Coreset Compression Algorithm for Large Scale Sensor Networks," filed on Apr. 13, 2012, which is incorporated herein by reference.

BACKGROUND

This invention relates to compression of large data sets, and in particular to selection of a coreset of points to represent sensor data.

The wide availability of networked sensors such as GPS receivers and cameras is enabling the creation of sensor networks that generate huge amounts of data. For example, vehicular sensor networks where in-car GPS sensor probes are used to model and monitor traffic can generate on the order of gigabytes of data in real time. These huge amounts of data are potentially usable for applications such as query-based searching and spatiotemporal data mining, but such applications can face storage-space problems as well as problems in efficiently accessing the motion data.

One approach to processing such huge amounts of data is to first compress it, for example as it is streamed from distributed sensors. However, such compression can be a challenging technical problem. Technical challenges include managing the computation required for such compression, as well as managing and characterizing the accuracy (e.g., compression error) introduced by using the compressed data as representing the originally acquired data.

One class of problems involves trajectory data, in which the data represents a time indexed sequence of location coordinates. The challenge of compressing such trajectories (also known as "line simplification") has been attacked from various perspectives: geographic information systems, databases, digital image analysis, computational geometry, and especially in the context of sensor networks. The input to this problem is a sequence P of n points that describes coordinates of a path over time. The output is a set Q of k points (usually subset of P) that approximates P. More precisely, the k-spline S that is obtained by connecting every two consecutive points in Q via a segment should be close to P according to some distance function. The set Q is sometimes called a coreset since it is a small set that approximates P. (Note that in the Description below, the term "coreset" is not used according to a definition in and is used in a manner more similar to usage in computational geometry.)

Several books have been written about the line simplification problem. The oldest heuristic for line simplification is the Douglas-Peucker heuristic (DPH). DPH gets an input threshold $\epsilon>0$ and returns a set Q that represents a k-spline S as defined above. DPH guarantees that the Euclidean distance from every p∈P to S is at most $\epsilon$. This is also the attractiveness of DPH, compared to other lossy data compression techniques such as wavelets. DPH is very simple, easy to implement, and has a very good running time in practice. The guaranteed $\epsilon$-error allows us to merge two compressed sets $Q_1$ and $Q_2$ in the streaming model, while keeping the $\epsilon$-error for $Q_1 \cup Q_2$. The DPH has been characterized as "achiev[ing] near-optimal savings at a far superior performance".

While DPH has a guaranteed $\epsilon$-error, it suffers from serious space problems due to its local (ad-hoc, greedy) optimization technique. In particular, the size k of its output is unbounded, and might be arbitrarily larger than the smallest set $Q \subseteq P$ that obtained such an $\epsilon$-error. While merging two sets preserve the error, it is not clear how to reduce the merged set again. The size of the compressed output will increase linearly with the input stream. Choosing a larger $\epsilon$ may result in too small or empty set Q for the first compressions. The worst case running time for the basic (and practical) implementation is $O(n^2)$. More modern versions of the DPH appear to have similar technical characteristics.

SUMMARY

In one aspect, in general, an approach to compression of a large (n point or samples) data set has a combination of several desirable technical properties not available in prior techniques. This combination of properties includes:

for a desired level of accuracy (referred to as $\epsilon$ below), the number of compressed points (a "coreset") representing the original data grows no faster than the logarithm of the number of points;

the level of accuracy comprises a guaranteed bound expressed as multiple of error of an associated line simplification of the data set;

for a desired level of accuracy and a complexity (e.g., number k of optimal line segments) of the associated line simplification, the computation time grows no faster than the number of original data points; and for a desired level of accuracy ($\epsilon$) and a complexity of the associated line simplification, the storage required for the computation grows only logarithmically in the number of original data points (n).

A specific advantage of at least some implementations as compared to a conventional Douglas-Peucker heuristic (DPH) applied to the original data with n points is that the DPH has a computational complexity of $O(n^2)$ while these implementations of the present approach have computational complexity of $O(n)$. Furthermore, the size of the compressed data for DPH can grow as quickly as linearly in n while these implementations are guaranteed to have compressed data size that grows only as log n.

In another aspect, in general, a computer-implemented method includes accepting first data representing a first plurality of data samples acquired from a set of one or more sensor, the first plurality of data samples having a first number of points in a data space. A computer-implemented compression procedure is applied to the first data to form second data representing a second plurality of points having a second number of points substantially smaller than the first number of points, and to provide a bound on an error associated with representing the first plurality of data samples by the second plurality of data samples. Applying the compression procedure includes determining a first plurality of line segments in the data space according to a procedure with a property that the number of line segments in the first plurality of line segments grows at most as a logarithm of the first number of points, and partitioning the first plurality of data samples into a plurality of parts each part being associated with a corresponding different line segment of the first plurality of line segments in the data space. The procedure further includes, for each part of the plurality of parts, selecting a subset of data samples of the part, and combining the selected subsets of data samples to form the second plurality of points. The second data representing the second plurality of points is provided as a compressed representation of the acquired first plurality of data samples.

Aspects may include one or more of the following features.

A quantity characterizing a desired level of accuracy of the second plurality of data samples as a compressed representation of the first plurality of data samples and/or a quantity characterizing a desired number of the line segments in the first plurality of line segments are accepted.

Applying the compression procedure further includes determining a bound of an error of representing the first plurality of points with the second plurality of points. In some examples, the determined bound is represented as a multiple of the desired level of accuracy. The determined bound may be represented as a multiple of an optimal error achievable to compress the first plurality of data samples according to a specified line simplification procedure.

Determining the first plurality of line segments includes forming a second plurality of line segments from the data samples, the number of line segments in the second plurality being determined according to a quantity characterizing a desired number of line segments, and augmenting the second plurality of line segments, including for at least some of the line segments of the second plurality of line segments, determining further line segments in a proximity of that line segment, a spacing and/or a number of the further line segments being determined according to a desired level of accuracy.

The number of line segments in the second plurality depends at most logarithmically on the number of points in the first plurality of data samples.

Forming the second plurality of line segments includes applying a number of iterations that depends at most logarithmically on the number of points in the first plurality of data samples, and at each iteration, determining a part of the second plurality of line segments.

Determining each part of the second plurality of line segments includes determines a number of line segments that is independent of the number of points in the first plurality of data samples.

Selecting the subset of data samples for a part of the data associated with a line segment comprises selecting a number of data samples determined according to the desired level of accuracy.

Determining further line segments in a proximity of that line segment comprises determining further line segments parallel to that line segment in the data space.

Determining further line segments in a proximity of that line segment comprises determining a grid of line segments in proximity to that line segment.

Determining further line segments in a proximity of that line segment comprises selecting a spacing of the further line segments according to a maximum distance of a data sample to a line segment of the first plurality of line segments.

The data compression procedure has a computation requirement that is of an order of a logarithm of the first number of points.

Accepting the first data comprises at least one of retrieving said data from a data storage system and receiving said data over a data communication system.

The method further includes storing the second data in a data storage system and/or transmitting said data over a data communication system.

Accepting the first data comprises accepting time indexed position measurements.

The method further includes applying a line simplification procedure to the second plurality of data samples.

The method further includes applying the compression procedure to separate parts of the first plurality of points to determine compressed representations of the separate parts, and applying the compression procedure to the compressed representations of the separate parts. In some examples, at least some of the applications of the compression procedure are performed in parallel, sequentially, or on different computers.

In another aspect, in general, software stored on a non-transitory machine readable medium comprises instructions for causing a data processing system (e.g., one or more computers) to perform any of the methods described above.

In another aspect, in general, software implemented system is configured to perform any of the methods described above.

Other features and advantages of the invention are apparent from the following description, and from the claims.

DESCRIPTION

Figure 1:
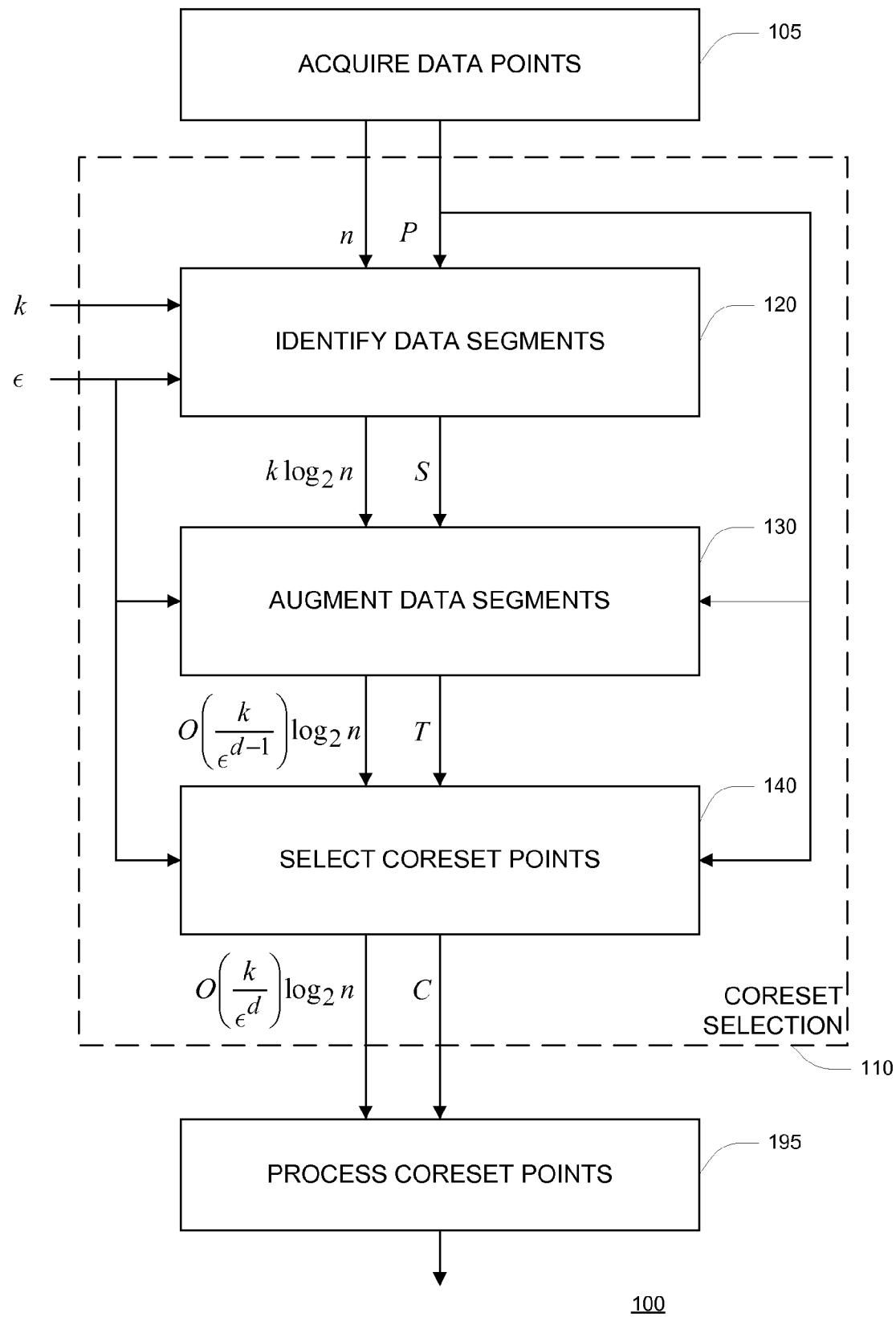
FIG. 1 is a data flow diagram.

Referring to FIG. 1, a data processing system implements a dataflow 100 that begins with acquiring n data points P (block 105). Each data point is in a data space represented as d-dimensional numerical vectors, for example, in $\mathbb{R}^d$. These data points are then compressed to a substantially smaller "coreset" C, which comprises a subset of the original points P, using a coreset selection procedure (block 110). Finally, the coreset points C are processed (block 195), generally using a conventional procedure, for example using a conventional line simplification procedure. The coreset selection procedure provides a substantially reduced number of points (i.e., O(log n) points), thereby reducing the computation requirements in the processing (block 195) as compared to processing all n of the originally acquired points. Furthermore, the coreset points are selected such that a bound (e.g., an additive bound) on an approximation/compression error is guaranteed. Furthermore, based on this bound of the error introduced through the coreset selection procedure, for at least some processing of the points (block 195) a bound on a multiplicative factor on the error introduced as a result of the processing of the coreset points as compared to optimal processing all the original points is also known.

In this implementation, the bound on the error between the coreset points and the original points is defined according to a Hausdorff Euclidean distance. Specifically, we define $dist_H(A, B)$ as the Hausdorff Euclidean distance between a pair of sets of points A, $B \subseteq \mathbb{R}^d$ as $$dist_H(A, B) := \max\left\{\max_{a \in A} \min_{b \in B} \|a - b\|, \max_{b \in B} \min_{a \in A} \|a - b\|\right\}$$

Note that when one set is a subset of the other, this distance represents a max-min distance:

$$dist_H(A, B) := \max_{a \in A} \min_{b \in B} \|a - b\| \quad \text{when } B \subseteq A$$

Generally, the coreset selection procedure constructs the coreset C such that the error introduced satisfies $$dist_H(P, C) \leq \epsilon \text{Opt}(P, k)$$

where $\epsilon$ is a user-provided level of accuracy (a dimensionless quantity) and where Opt(P, k) is the optimal error approximating the original points P by a k-spline S.

More precisely, we define $$Opt(P, k) \triangleq \min_S dist_H(P, S) = dist_H(P, S^*)$$

Note, however, that neither Opt(P, k) nor S* need to be explicitly found in the procedure. Rather, Opt(P, k) provides a reference upon which the error of the compression is based. For example, a user may desire to compress $n=10^6$ data points such that the error is no more than 1% (i.e., $\epsilon=0.01$) of the optimal error representing the points using a spline with $k=100$ segments. Note that $\epsilon$ multiplies the optimal error Opt(P, k), for example, which may be in units of distance or a combination of units of distance and time.

Figure 2:
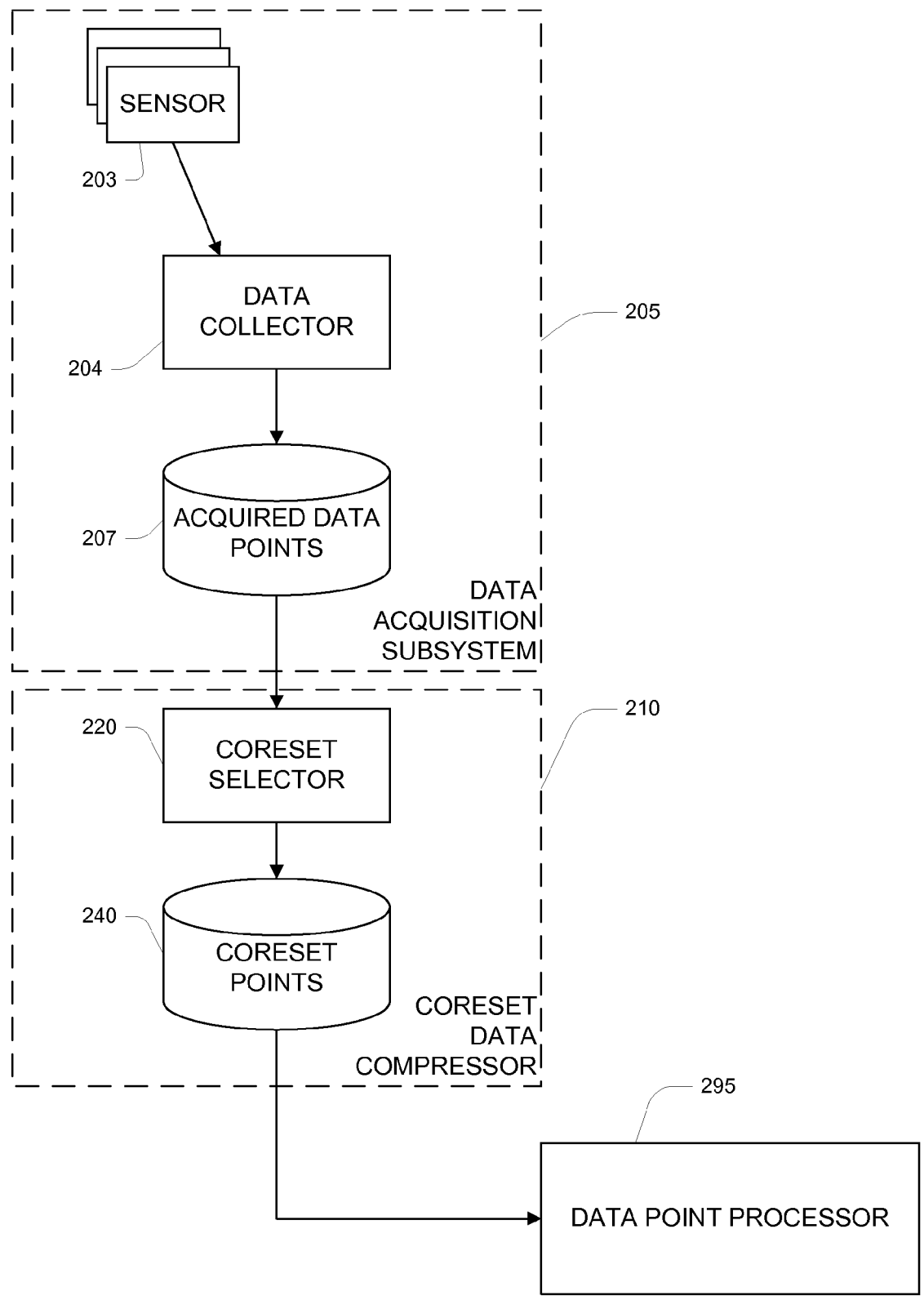
FIG. 2 is a system block diagram.

Referring to FIG. 2, an implementation of the data flow shown in FIG. 1 includes a data acquisition subsystem 205, a coreset data processor 210, and a data point processor. The data acquisition subsystem 205 generally includes a number of sensors 203 (e.g., anywhere from one to millions!), which provide data points to a data collector 204, for example, implemented as a centralized computer based server. The data collector maintains a storage 207 of the data points. In some examples, the data collector maintains all the points that are acquired. In some implementations, which are discussed later in this document, the data collector maintains a window and/or a summary (e.g., one or more coresets) of past data points, but is not required to maintain a complete history. The coreset selector uses the data points in the storage 207 of the data acquisition subsystem 205 and implements the coreset selection procedure (block 110 of FIG. 1) and stores the coreset points in a storage 204. A data point processor 295 implements to processing of the coreset points (block 195 of FIG. 1). Note that the components illustrated in FIG. 2 may be hosted on multiple distinct computers, which may be geographically separated (e.g., communicating over data networks), and each component may itself be implemented by multiple computers or processors, for instance to perform certain computations in parallel.

It should be understood that the data flow illustrated in FIG. 1 is applicable to a wide range of types of data. One class of data is sensor data P be a set of points in $\mathbb{R}^d$, where $d \geq 2$ is constant, and every point $p \in P$ is of the form $p=(x_1, \ldots, x_{d-1}, t)$. The first coordinates $(x_1, \ldots, x_{d-1})$ represent outputs (real numbers) from d-1 sensors at time t. We denote the last coordinate of a point $p=(x_1, \ldots, x_{d-1}, x_d)$ by $p(t):=x_d$. For example, in a GPS tracking example, each data point may comprise $(x_1, x_2)$ as the latitude and longitude of a sample provided by a sensor, and $x_3=t$ as the time of the position sample, and therefore $d=3$.

The approach to selection of the coreset points is largely insensitive to the specific point processing that will be performed on the coreset points. As a representative example of the type of processing is compatible with the coreset processing, a k-spline point processing procedure. In particular, a Douglas-Peucker heuristic (DPH) is applied to the coreset points. DPH gets an input threshold $\epsilon$ and returns a set Q that represents a k-spline S. We call a set $S \subset \mathbb{R}^d$ a k-spline if it is the union of k segments $\overline{s_0 s_1}, \overline{s_1 s_2}, \ldots, \overline{s_{k-1} s_k}$ for some $s_0, \ldots, s_k \in \mathbb{R}^d$, where $s_0(t) < \ldots < s_k(t)$. The segment $\overline{s_{i-1} s_i}$ is called the i th segment of S, for $i \in \{1, \ldots, k\}$.

The regression distance $dist_R(\{p\}, S)$ between a point $p \in \mathbb{R}^d$ and a k-spline S is the Euclidean distance between p and S along the last coordinate axis, i.e., $$dist_R(\{p\}, S) := \begin{cases} \|p - s\| & \text{if } \exists s \in S \text{ s.t. } p(t) = s(t) \\ \infty & \text{otherwise,} \end{cases}$$

where $\|\cdot\|$ denotes the Euclidean norm. The regression distance between a set $P \subset \mathbb{R}^d$ and a k-spline S is the maximum regression distance between a point in P to S, i.e., $$dist_R(P, S) := \max_{p \in P} dist_R(\{p\}, S).$$

Referring again to FIG. 1, the coreset selection procedure (block 110) can be represented as comprising three phases: identification of a number of line segments (block 120); augmentation of the line segments (block 130); and finally selection of the coreset points (block 140).

In the first phase, the initial set of line segments, S is identified in an iterative procedure that has at most $\log_2 n$ iterations. In the first iteration, n/2 points (not necessarily exactly, but in the order of half the points) are associated with k line segments. Each segment $S_i \in S^*$ represents a line segment in $\mathbb{R}^d$ for example by its two endpoints. For any segment $S_i \in S^*$, we denote a subset of points associated with that segment as $P_i \in P$. In a second iteration, n/4 of the points (i.e., half the points not yet associated with segments) are associated with k further segments. More generally, in the $m^{th}$ iteration, $n/2^m$ points are associated with k further segments, which means that at most $m = \log_2 n$ iteration are required. Note that in alternative embodiments, other approaches may be used to select the points at each iteration, for example, using a different fixed fractions than one half, while maintaining the logarithmic bound on the number of iterations needed. Furthermore, it is not necessary that the line segments are necessarily straight lines—other types of line segments, for instance quadratic curves, could be used.

A variety of techniques can be used to select the k segments forming the set of segments $\{S_i\}$ at each iteration (indexed by i). In one approach, at each iteration, a relatively small subset of data points Q made up of remaining (i.e., as yet not associated with a segment) points is chosen from P at random from a uniform distribution. The total number of points in Q is selected to be $O(k/\epsilon)$, for example, randomly selecting points until a predetermined constant multiple of $(t/\epsilon)$ points are select. Note that the number of points in the subset Q does not scale with the total number of points n in P, and therefore the space and time requirement for find the k segments is independent of n. The k segments $S_i$ are then determined from Q according to an existing k line segment procedure (e.g., using DPH). The distance of each point to the closest line segment is computed to select the half of the remaining points that are closest to the segments, noting which segment element each point is associated with. The set of segments $S = \cup_i \{S_i\}$ is formed as the union (indexed over the iterations i) of the segments identified in the log n iterations.

In the second phase of the procedure (block 130), the set of segments S is augmented to form a set of segments $T = \cup_i T_i$, where $T_i$ is a set of segments that is determined from the segment $S_i$ and are close proximity to $S_i$ (note that the index i is over all the segments of S, $1 \leq i \leq |S| \leq k \log_2 n$). In particular, $T_i$ forms an "$\epsilon$-grid" of segments around the segment $S_i$. This grid of segments has the property that for each point $p \in P_i$, the distance from p to $S_i$ is denoted $dist_R(p, S_i)$. The set of segments $T_i$ is sufficiently dense to guarantee that the distance that the closest distance $dist(p, T_i) = \min_{t \in T_i} dist(p, t)$ is no greater than $\epsilon \, dist_H(p, S_i)$. One way to construct the $\epsilon$-grid (for $d=2$) is to form a set of $\lceil 1/\epsilon \rceil$ parallel segments to $S_i$ with spacing determined by the distance of the farthest point from $S_i$. For $d > 2$, the grid may be extended to d-1 dimensions to form $O(\epsilon^{d-1})$ elements in a set of line segments $T_i$. Therefore, the number of line segments in T is $O(k/\epsilon^{d-1}) \log_2 n$.

The coreset selection procedure (block 140) makes use of the segments of T. During or after the construction of the augmented set of segments T, each point $p \in P$ is associated with a closest point p' on one of the segments t∈T. The union of these projected points is denoted $C'_i = \{p' | p \in P_i\}$ for a particular segment $S_i$, and $T = \cup_i T_i$ and $C' = \cup_i C'_i$ over all the segments $S_i$. Note that the maximum distance between a point p and its projection p' is $\max_i \text{dist}_H(P_i, C'_i)$ which by the construction is no greater than $\epsilon \text{ dist}(P_i, S_i)$, which is no greater than the worst case (maximum) over all segments $S_i$.

Let $t \subseteq T_i$ denote one of the segments of $T_i$ that was constructed in the second phase, that contains at least one points from C', i.e., $C' \cap t \neq \emptyset$. Let $p'_L$, $p'_R$ denote the leftmost and rightmost points from C' on t, respectively. A subset of points in the set $C' \cap t$ are chosen to belong to the final coreset. One approach to selecting this subset of points is to first partition the segment $\overline{p'_L, p'_R} \subseteq t$ into $r = O(1/\epsilon)$ equal subsegments $t_1, \ldots, t_r$. For every such sub-segment $t_j$, $1 \leq j \leq r$ that contains at least one point from C', pick a single point $p'_j \in C' \cap t_j$. We call $p'_j$ the representative of every $p' \in C' \cap t_j$. Let $C'_t = \{p'_j | 1 \leq j \leq r, t_j \cap C' \neq \emptyset\}$ be the union of these representatives on t. Let $C'' = \cup_t C'_t$ where the union is over all the segments of T.

Recall that every point $p' \in C'' \subseteq C'$ is the projection of some p∈P on t. The final output coreset is then constructed as $C = \{p \in P | p' \in C''\}$. Because there are $O(k/\epsilon^{d-1}) \log_2 n$ elements in T and each t∈T provides at most $O(1/\epsilon)$ representatives, the total size of the coreset is $O(k/\epsilon^d) \log_2 n$.

A proof that $\text{dist}_H(P, C) \leq \epsilon \text{Opt}(P, k)$ for a coreset C constructed according to the above procedure may be found in Dan Feldman, Andrew Sugaya, and Daniela Rus. 2012. "An effective coreset compression algorithm for large scale sensor networks." In *Proceedings of the 11th international conference on Information Processing in Sensor Networks* (IPSN '12). ACM, New York, N.Y., USA, 257-268. This publication (hereinafter "the ACM paper") is incorporated herein by reference.

In some examples, the coreset of points C is processed according to a k-spline or k line segment procedure, using the same value of k that is used in the construction of the coreset. As an example, in a vehicular network application, we may have a series of GPS points representing a vehicle traveling between several destinations. Instead of using all n GPS points on its path to represent the path, we would like to create the k-spline center in order to compress the data. As introduced above, the k-spline center S*(P, k) of a set P of n points is a set of k connected segments that approximates P. The time it takes to compute S*(P, k) directly is near-quadratic in n and therefore impractical for large data sets. Instead of trying to improve this kind of optimization algorithms, we apply a line simplification procedure to the small coreset C to get its k-spline center S*(C, k).

If the GPS data points have d=3 dimensions (i.e., time and horizontal coordinates), then C has $O(k/\epsilon^3) \log_2 n$ points rather than the original n. Finding an optimal solution S'=S* (C, k) as a k-spline on the coreset C yields the following bounds:

$$\text{dist}_H(P, S') \leq \epsilon + \text{dist}_H(P, S^*)$$

which generally follows from application of a triangle inequality:

$$\text{dist}_H(P, S') \leq \text{dist}_H(P, C) + \text{dist}_H(C, S')$$
$$\leq \text{dist}_H(P, C) + \text{dist}_H(C, S^*)$$

Furthermore, if $\text{dist}_H(P, S^*) \geq 1$ then a multiplicative bound $$\text{dist}_H(P, S') \leq (1+\epsilon) \text{dist}_H(P, S^*).$$

also follows.

Note that in other examples, the processing of the coreset data does not have to comprise a k-spline or k-line segment procedure, or to necessarily use as large a value of k as in the coreset generation process. The coreset compression approach described above provides a guarantee on the approximation error for any query and not for a specific family of queries (k-points, k-lines, etc.).

One significant advantage of coresets as described above is that they can be constructed in parallel, as well as in a streaming setting where data points arrive one by one, in which it is impossible to remember the entire data set due to memory constraints. A key insight is that coresets satisfy certain composition properties.

The approach described above can be implemented in a static, off-line, centralized processing, for example, with the entire data set P being available in storage (e.g., database) accessible to a central computer server. Alternative implementations of the coreset construction approach are applicable to parallel and distributed computing, as well as in a streaming setting where data points arrive one by one and remembering the entire data set is futile due to memory constraints. Some such alternatives use a map-and-reduce technique.

As an example, if a dataset P is partitioned into two parts such that $P = P_1 \cup P_2$. The coreset construction procedure described above can be applied separately (with the same value of k and $\epsilon$) to each part yielding coresets $C_1$ and $C_2$ for data sets $P_1$ and $P_2$ respectively. Taking the union of the coresets $C = C_1 \cup C_2$ yields an $\epsilon$-coreset for $P = P_1 \cup P_2$.

Note however that the union of the coresets is generally larger than had the coreset been constructed directed on the complete set P. However, the coreset construction procedure can be applied again (again with the same value of k and $\epsilon$) to compress the coreset C to a smaller coreset D. Such a procedure is shown in the ACM paper to only double the bound on the error.

In a parallel implementation, computations can be represented in a binary tree, for example with $2^L$ leaves. Each leaf represents a processing of $n/2^L$ original points, and each interior node and the root node represents a combination two two coresets to form a smaller coreset. The coreset at the root node of the tree then provides a compression a bound that is at most $2^L$ larger (i.e., doubling for each level in the tree).

Such a tree-structured arrangement is not necessarily limited to a binary tree. For example, a uniform n-way branching tree, or an irregular tree with at most L levels can be processed in the same manner.

Note also that the processing of the data does not have to be centralized. For example, M sensors may each collect data and individually provide a coreset computed locally to the sensor. These coresets are then communicated to one (or more) computation nodes (e.g., computer servers), that perform the further coreset compression. The result of the two (or more levels) of coreset computation maintain the well-defined bound on the error.

In a streaming setting, one technical goal is to maintain a coreset over time, while keeping only a small subset of O(log n) coresets in memory (each of small size). The idea is to construct and save in memory a coreset for every block of consecutive points arriving in a stream. When two coresets in memory, they can be merged. Another implementation of this approach effectively uses a binary tree-structured arrangement in which coreset nodes are effectively processed from left to right so that at any time, at most one leaf node of data is stored, and log n coresets (at various levels) are stored.

A combination of streaming and parallel implement can also be used, for example, with a sensor processing portions of data in a streaming manner as described above, and then transmitting the resulting coreset for further processing in a streaming and/or parallel mode.

As introduced above, one type of sensor is a GPS sensor, for example, in a smartphone or a vehicle, which collects time-stamped GPS location triples (time, latitude, longitude), optionally further including altitude. After forming the k-spline of the data, a series of locations traversed by the sensor can be determined as a summary of the trajectory.

Implementations can include software, hardware, and a combination of hardware and software. The software can include instructions, which may be stored on a non-transitory machine-readable medium, for causing a processor to perform the procedures described above. Various types of processor may be used, including general purpose processors (e.g., computer central processing units (CPU)), signal processors, and graphics processing units (GPUs). GPUs are installed today on most desktop computers and recently on smart phones (such as the Nexus One and iPhone). The GPU is essentially a set of dozens or hundreds of processors that are able to make parallel computations. However, the model of computation is relatively restrictive. In particular, non trivial linear algebra computations suffers from significant numerical problems. In some implementations, a coreset is computed on the GPU and using the CPU to compute the desired result on the coreset. Most of the construction time of the coreset is spent on matrix multiplication (computing distances from points to segments) that can be computed on the GPU. Also, division operations (that usually cause the numerical problems) are applied by optimization algorithms only on the CPU. Other implementations may make use of application specific integrated circuits (ASICs) and/or other special-purpose logic.

It is to be understood that the foregoing description is intended to illustrate and not to limit the scope of the invention, which is defined by the scope of the appended claims. Other embodiments are within the scope of the following claims.

What is claimed is:

1. A computer-implemented method comprising:
   accepting first data representing a first plurality of data samples acquired from a set of one or more sensor, the first plurality of data samples having a first number of points in a data space;
   applying a computer-implemented compression procedure to the first data to form second data representing a second plurality of points having a second number of points substantially smaller than the first number of points, and to provide a bound on an error associated with representing the first plurality of data samples by the second plurality of data samples, wherein applying the compression procedure includes
   determining a first plurality of line segments in the data space according to a procedure with a property that the number of line segments in the first plurality of line segments grows at most as a logarithm of the first number of points,
   partitioning the first plurality of data samples into a plurality of parts each part being associated with a corresponding different line segment of the first plurality of line segments in the data space,
   for each part of the plurality of parts, selecting a subset of data samples of the part, and
   combining the selected subsets of data samples to form the second plurality of points;
   providing the second data representing the second plurality of points as a compressed representation of the acquired first plurality of data samples.

2. The method of claim 1 further comprising accepting a quantity characterizing a desired level of accuracy of the second plurality of data samples as a compressed representation of the first plurality of data samples.

3. The method of claim 2 further comprising accepting a quantity characterizing a desired number of the line segments in the first plurality of line segments.

4. The method of claim 2 wherein applying the compression procedure further includes determining a bound of an error of representing the first plurality of points with the second plurality of points.

5. The method of claim 4 wherein the determined bound is represented as a multiple of the desired level of accuracy.

6. The method of claim 5 wherein the determined bound is further represented as a multiple of an optimal error achievable to compress the first plurality of data samples according to a specified line simplification procedure.

7. The method of claim 1 wherein determining the first plurality of line segments comprises:
   forming a second plurality of line segments from the data samples, the number of line segments in the second plurality being determined according to a quantity characterizing a desired number of line segments; and
   augmenting the second plurality of line segments, including for at least some of the line segments of the second plurality of line segments, determining further line segments in a proximity of that line segment, a spacing and/or a number of the further line segments being determined according to a desired level of accuracy.

8. The method of claim 7 wherein the number of line segments in the second plurality depends at most logarithmically on the number of points in the first plurality of data samples.

9. The method of claim 7 wherein forming the second plurality of line segments includes applying a number of iterations that depends at most logarithmically on the number of points in the first plurality of data samples, and at each iteration, determining a part of the second plurality of line segments.

10. The method of claim 9 wherein determining each part of the second plurality of line segments includes determines a number of line segments that is independent of the number of points in the first plurality of data samples.

11. The method of claim 7 wherein selecting the subset of data samples for a part of the data associated with a line segment comprises selecting a number of data samples determined according to the desired level of accuracy.

12. The method of claim 7 wherein determining further line segments in a proximity of that line segment comprises determining further line segments parallel to that line segment in the data space.

13. The method of claim 7 wherein determining further line segments in a proximity of that line segment comprises determining a grid of line segments in proximity to that line segment.

14. The method of claim 7 wherein determining further line segments in a proximity of that line segment comprises selecting a spacing of the further line segments according to a maximum distance of a data sample to a line segment of the first plurality of line segments.

15. The method of claim 1 the data compression procedure has a computation requirement that is of an order of a logarithm of the first number of points.

16. The method of claim 1 wherein accepting the first data comprises at least one of retrieving said data from a data storage system and receiving said data over a data communication system.

17. The method of claim 16 further comprising at least one of storing the second data in a data storage system and transmitting said data over a data communication system.

18. The method of claim 1 wherein accepting the first data comprises accepting time indexed position measurements.

19. The method of claim 1 further comprising applying a line simplification procedure to the second plurality of data samples.

20. The method of claim 1 further comprising applying the compression procedure to separate parts of the first plurality of points to determine compressed representations of the separate parts, and applying the compression procedure to the compressed representations of the separate parts.

21. The method of claim 20 wherein at least some of the applications of the compression procedure are performed in parallel, sequentially, or on different computers.

* * * * *